(12) United States Patent
Kawano et al.

(10) Patent No.: US 9,640,470 B2
(45) Date of Patent: May 2, 2017

(54) SEMICONDUCTOR MODULE

(71) Applicant: Mitsubishi Electric Corporation, Tokyo (JP)

(72) Inventors: Yu Kawano, Tokyo (JP); Akihiko Mori, Tokyo (JP); Yoshihito Asao, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/904,160

(22) PCT Filed: Nov. 5, 2013

(86) PCT No.: PCT/JP2013/079831
§ 371 (c)(1),
(2) Date: Jan. 11, 2016

(87) PCT Pub. No.: WO2015/068196
PCT Pub. Date: May 14, 2015

(65) Prior Publication Data
US 2016/0148862 A1 May 26, 2016

(51) Int. Cl.
*H01L 23/495* (2006.01)
*H01L 23/50* (2006.01)
*H01L 25/07* (2006.01)
*H01L 25/18* (2006.01)
(Continued)

(52) U.S. Cl.
CPC .... *H01L 23/49575* (2013.01); *H01L 23/3107* (2013.01); *H01L 23/49503* (2013.01); *H01L 23/49524* (2013.01); *H01L 23/49537* (2013.01); *H01L 23/49541* (2013.01); *H01L 23/49555* (2013.01); *H01L 23/49562* (2013.01); *H01L 23/50* (2013.01); *H01L 24/40* (2013.01); *H01L 24/41* (2013.01); *H01L 25/07* (2013.01); *H01L 25/072* (2013.01); *H01L 25/18* (2013.01); *H01L 2224/0603* (2013.01); *H01L 2224/40139* (2013.01); *H01L 2224/40225* (2013.01);
(Continued)

(58) Field of Classification Search
CPC .................................................. H01L 23/49575
See application file for complete search history.

(56) References Cited

U.S. PATENT DOCUMENTS 7,545,033 B2 * 6/2009 Grant .................... H01L 25/165
257/706
8,649,159 B2 * 2/2014 Fujita .................... H01L 25/072
310/43

(Continued)

FOREIGN PATENT DOCUMENTS

JP 2011-250491 A 12/2011
JP 2013-012525 A 1/2013

*Primary Examiner* — Eugene Lee
(74) *Attorney, Agent, or Firm* — Sughrue Mion, PLLC; Richard C. Turner

(57) ABSTRACT

A common connecting section for connection to terminals at the same potential in circuits is placed outside a mold section to allow a reduction in size of a semiconductor module 1. Since the common connecting section is a portion of a lead frame which would be placed within such a mold section in a conventional semiconductor module, the mold section can be reduced in size as compared with the conventional one, thereby reducing the amount of mold resin and the material cost.

14 Claims, 8 Drawing Sheets

(51) Int. Cl.
*H01L 23/00* (2006.01)
*H01L 23/31* (2006.01)

(52) U.S. Cl.
CPC ......... *H01L 2224/4809* (2013.01); *H01L 2224/73221* (2013.01)

(56) References Cited

U.S. PATENT DOCUMENTS

| | | | |
|---|---|---|---|
| 8,981,539 B2* | 3/2015 | Xue | H01L 23/492 257/672 |
| 2003/0067065 A1* | 4/2003 | Lee | H01L 23/49575 257/691 |
| 2011/0285226 A1 | 11/2011 | Fujita et al. | |
| 2013/0200397 A1* | 8/2013 | Biwa | H01L 31/173 257/82 |
| 2014/0145193 A1 | 5/2014 | Kadoguchi et al. | |
| 2015/0380384 A1* | 12/2015 | Williams | H01L 24/97 438/112 |

* cited by examiner

SEMICONDUCTOR MODULE

CROSS REFERENCE TO RELATED APPLICATIONS

This application is a National Stage of International Application No. PCT/JP2013/079831, filed Nov. 5, 2013, the contents of which are incorporated herein by reference in its entirety.

TECHNICAL FIELD

The present invention relates to a semiconductor module in which a plurality of semiconductor devices are mounted on a lead frame.

BACKGROUND ART

Conventionally known semiconductor modules have a plurality of electronic components including semiconductor devices such as switching elements, mounted on a lead frame such that they are sealed in with mold resin. The lead frame is fabricated by pressing, etching, or cutting a sheet of metal plate material.

Thus, respective areas of the lead frame, that is, seats for mounting a semiconductor chip or terminals for connection to external parts, are appropriately run not to overlap each other. Unnecessary portions of the lead frame on the periphery are cut after a mold section is molded Such semiconductor modules require effective use of the lead frame and reduction in module size, and efforts have been made to realize them. For example, in a semiconductor module presented in PTL 1, size reduction is sought by integrating a plurality of terminals to reduce the number of the terminals.

In PTL 1, a power wiring substrate is used to perform connection of inverter input terminals or connection of inverter ground terminals. The connection of the terminals made outside the semiconductor module can eliminate the need to incorporate wiring for connecting the terminals into the semiconductor module, thereby reducing the size of the module.

PTL 2 has presented a power module in which a guide frame corresponding to a portion of a lead frame to be cut is appropriately placed such that a portion of the guide frame is not cut but used as a wiring section. This can improve the yields of the lead frame material and limit distortion of each lead frame.

CITATION LIST

Patent Literatures

PTL 1: JP-A-2011-250491
PTL 2: JP-A-2013-12525

SUMMARY OF INVENTION

Technical Problems

In the semiconductor module presented in PTL 1, however, the plurality of terminals are integrated to reduce the number of the terminals, but a plurality of terminals at the same potential level are still present and the module has a room for size reduction. In addition, to connect the terminals extended from the semiconductor module on the power substrate, those terminals need to be run to reach the power substrate.

The power substrate is typically used for connection of a plurality of terminals or shared with another semiconductor module. The terminal connected to the power substrate needs to have a relatively long length, which results in a larger size of the lead frame or an increased number of portions to be discarded.

In PTL 2, the portion of the conventionally cut guide frame is effectively used to reduce portions to be discarded, but the size reduction of the semiconductor module itself is not possible. Rather, an increase in size of the mold section is expected since the mold section contains the wiring section provided by effectively using the guide frame.

The present invention has been made in view of the above problems, and it is an object thereof to provide a semiconductor module in which a lead frame can be effectively used and the size of the module can be reduced.

Solution to Problems

A semiconductor module according to the present invention is a semiconductor module including a lead frame having a plurality of seats electrically independent of each other, a plurality of electronic parts including a plurality of semiconductor devices mounted on the seats, and a mold section provided by integrating the lead frame and the electronic parts with a mold resin, the plurality of electronic parts constituting a plurality of circuits, a portion of the lead frame extended to the outside of the mold section providing a plurality of terminals each connecting the circuit to an external part, characterized by comprising a common connecting section connecting at least one set of the terminals at the same potential in the circuits outside the mold section, and characterized in that the common connecting section serves as a common wiring for power source lines, or ground lines, or other wirings in the circuits and serves as a terminal for the common wiring.

Advantageous Effects of Invention

The semiconductor module according to the present invention can achieve the effective use of the lead frame and the size reduction of the module by including the common connecting section for connecting the terminals at the same potential in the circuits outside the mold section.

Other objects, characteristics, aspects, and advantages of the present invention will be apparent from the following detailed description of the present invention with reference to the accompanying drawings.

DESCRIPTION OF EMBODIMENTS

Embodiment 1

Figure 1:
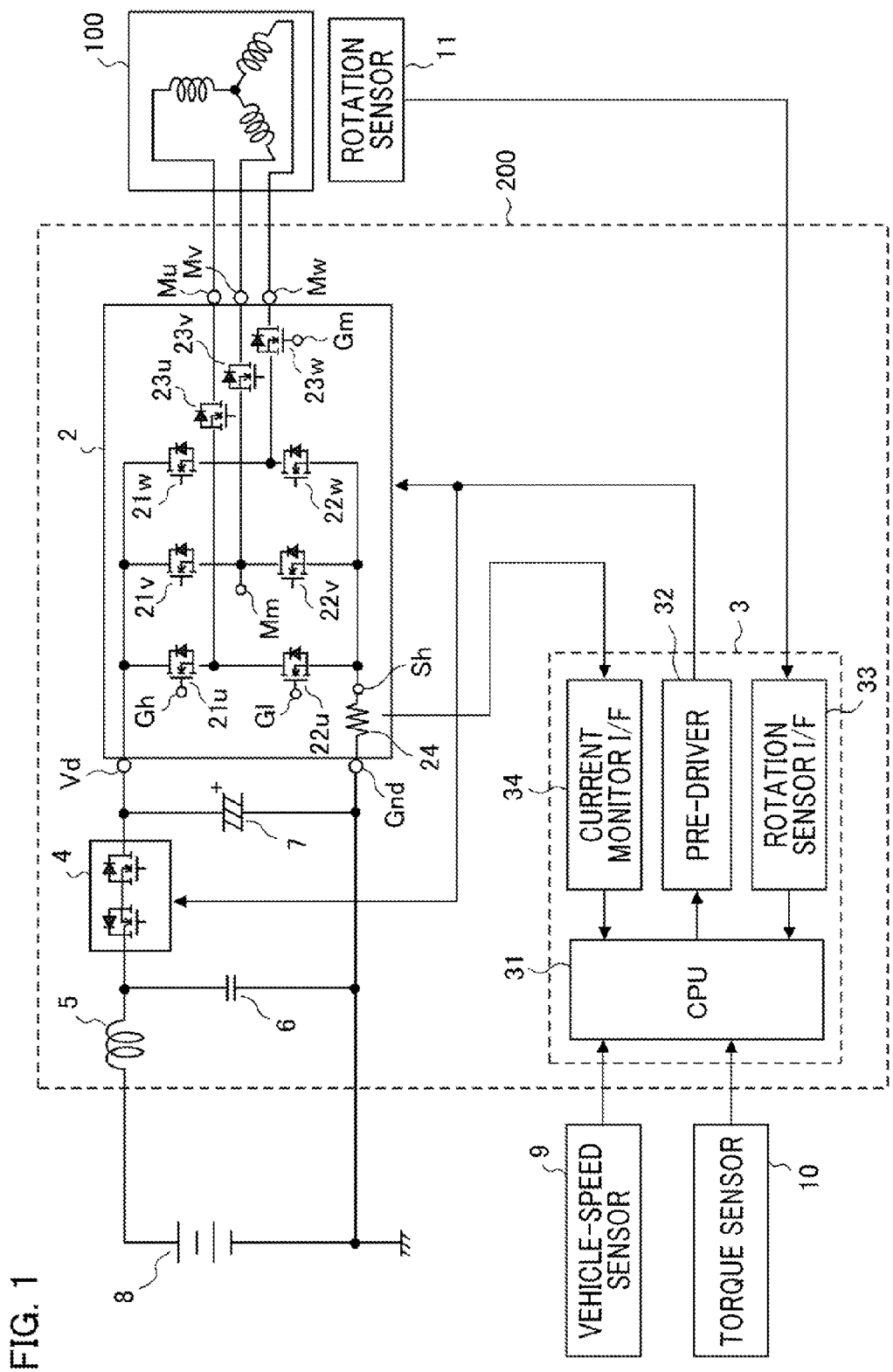
FIG. 1 is an overall circuit diagram of a power steering apparatus in which a semiconductor module according to Embodiment 1 of the present invention is used.
Figure 2:
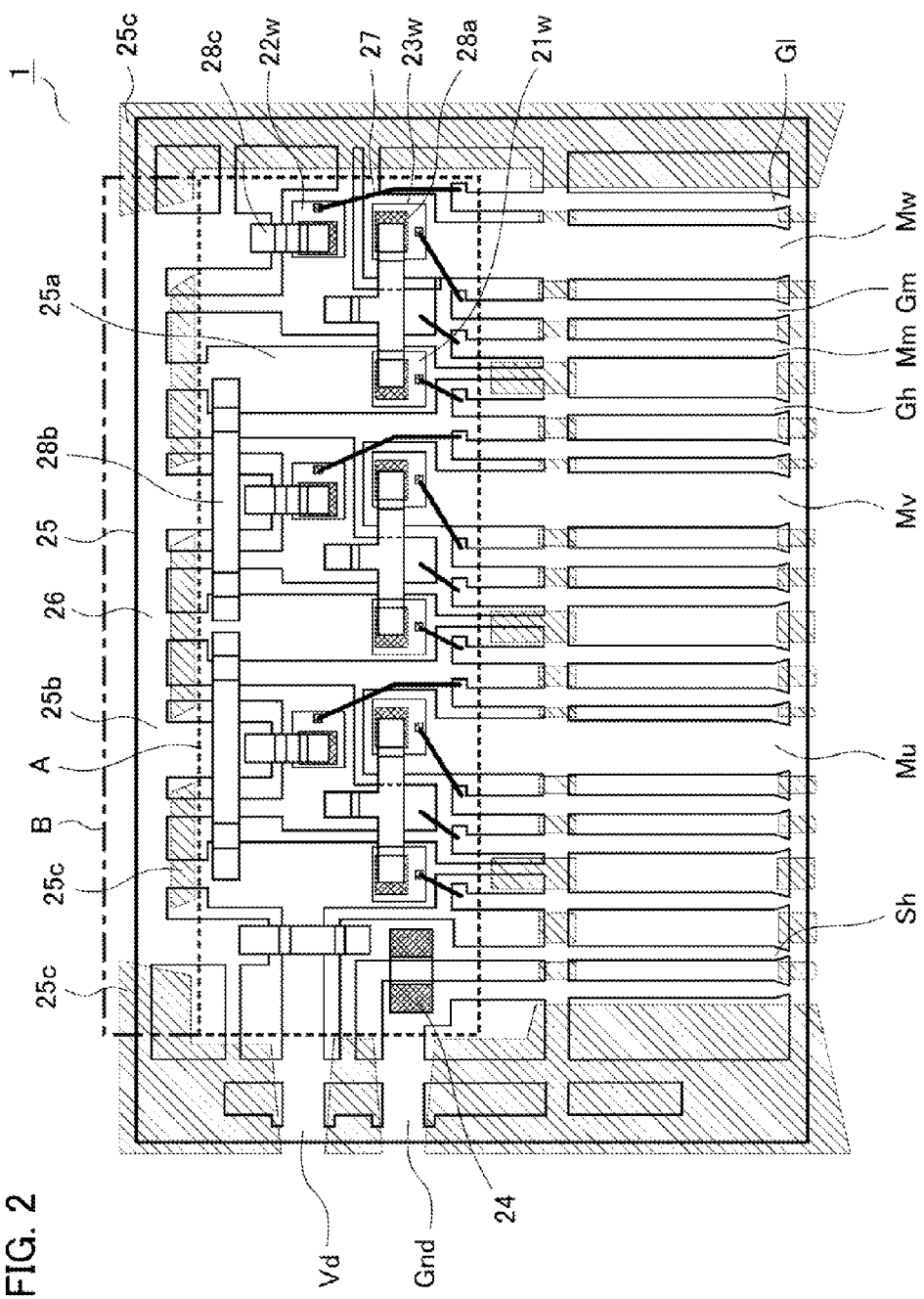
FIG. 2 is a plan view transparently showing a semi-finished product of the semiconductor module according to Embodiment 1 of the present invention.

A semiconductor module according to Embodiment 1 of the present invention will hereinafter be described with reference to the drawings. FIG. 1 is an overall circuit diagram of a power steering apparatus in which the semiconductor module according to Embodiment 1 is used. FIG. 2 is a plan view transparently showing a semi-finished product of the semiconductor module according to Embodiment 1. In FIG. 2, components identical or corresponding to those in FIG. 1 are designated with the same reference numerals.

As shown in FIG. 1, the power steering apparatus is formed of a motor 100 which is a three-phase permanent magnet motor and a control unit 200, and they are integrated into one. The control unit 200 includes an inverter circuit 2 for supplying electric power to motor windings, a power source section for supplying the power source to the inverter circuit. 2, and a control substrate 3 including a CPU 31 and its peripheral circuits. The inverter circuit 2 is constituted of a single part as a semiconductor module 1 according to Embodiment 1.

The control unit 200 of the power steering apparatus is described with reference to FIG. 1. The power source section is formed of a relay 4 for connecting or disconnecting a power source line, a coil 5 for noise suppression, and capacitors 6, 7. Electric power for the power source section is supplied by a battery 8 serving as an electric storage apparatus.

The inverter circuit 2 includes six switching elements in total including three pairs of upper arm switching elements 21 and lower arm switching elements 22 for the three-phase (U phase, V phase, and W phase) windings of the motor 100. Switching elements 23 responsible for connecting and disconnecting the power supply to the motor 100 are placed for the respective phases.

The CPU 31 in the control substrate 3 receives signals from a vehicle-speed sensor 9 and a torque sensor 10 and receives a signal from a rotation sensor 11 through a rotation sensor interface 33. The CPU 31 also receives a signal from a current monitor (not shown) through a current monitor interface 34.

The CPU 31 computes and outputs a handle assist amount to the inverter circuit 2 through a pre-driver 32. A terminal serving as a terminal of each switching element of the inverter circuit 2 is connected to the CPU 31 through the pre-driver 32 such that each switching element is controlled by the CPU 31. In FIG. 1, Gh, Gl, and Gm represent the terminals for control signal of switching elements 21u, 22u, and 23w.

Three terminals Mm for voltage monitor are provided between the upper and lower arm switching elements 21 and 22. A monitor terminal Sb is provided upstream from a shunt resistance 24 for current detection. These terminals are connected to the CPU 31 through the current monitor interface 34, for example. Terminals Mu, Mv, and Mw for motor output associated with the respective phase windings are connected to the motor 100.

Next, description is made of the configuration of the semiconductor module 1 according to Embodiment 1 with reference to FIG. 2. A lead frame 25 made of alloy material containing copper or iron has a plurality of seats (hereinafter referred to as die pads) electrically independent of each other. A plurality of semiconductor devices and other electronic parts are mounted on the die pads with an electrically conductive bonding material interposed between them. For example, in FIG. 2, a switching element 21w is mounted on a die pad 25a.

For example, Field Effect Transistors (FETs) are used as the switching elements 21, 22, and 23 mounted on the die pads. In FIG. 2, the lead frame 25 has a plurality of die pads and terminals, and a plurality of electronic parts are present, but only some of them are designated with reference numerals to avoid complication.

The lead frame 25 is fabricated by pressing, etching, or cutting a sheet of metal plate, and its areas are run not to overlap each other. The pressing has the advantage of high manufacturability, the etching has the advantage of a short delivery time, and the cutting has the advantage of low cost.

Beams 28a, 28b, and 28c (collectively referred to as a beam 28) placed as a bridge over the lead frame 25 are made of copper or iron-based material, and connect between semiconductor devices, between lead frames, or between a semiconductor device and a lead frame.

In FIG. 2, the terminals (Mv, Mu, Mw, Mm, Gh, Gm, and Gl) connected to external parts are extended downward. These terminals are connected to the lead frame 25 or the semiconductor device with a wire bond 27.

The lead frame 25, the switching elements 21, 22, and 23, the other electronic parts, the wire bond 27, and the beam 28 are sealed in with a mold resin of epoxy-based resin and integrated. In FIG. 2, a broken line A indicates a region corresponding to a mold section of the semiconductor module 1 in Embodiment 1.

After the mold section is molded in the region indicated by the broken line A, an unnecessary lead frame 25c indicated by hatch lines in FIG. 2 is cut to finish the semiconductor module 1. Other than the method of covering the respective areas with the mold resin made of the epoxy-based resin, a method of filling the inside of an outer frame formed by a mold resin with a silicon resin can be used, and either of them can be used.

As described above, the semiconductor module 1 contains a plurality of circuits formed of the plurality of semiconductor devices and the other electronic parts in the mold section. A portion of the lead frame 25 is extended to the outside of the mold section and constitutes a plurality of terminals for connecting the respective circuits to the external parts.

The semiconductor module 1 also has a common connecting section 26 for connecting, out of the plurality of terminals, at least one set of terminals at the same potential in the circuits outside the mold section. The common connecting section 26 serves as a common wiring for the power source line or ground line or other wirings in the circuits, and as a terminal for the common wiring. To enhance the effect of the common connecting section 26, it is desirable to connect all the terminals at the same potential in the circuits in the common connecting section 26.

In the inverter circuit 2 shown in FIG. 1, various configurations are possible as to which terminals are connected to the common connecting section 26. In Embodiment 1, the terminals for sources of the lower arm switching elements 22u, 22v, and 22w upstream from the shunt resistance 24 are selected.

As shown in FIG. 2, the common connecting section 26 is formed of an outer lead frame 25b and is fabricated as a portion of the lead frame 25 with the abovementioned method. As indicated by the broken line A in FIG. 2, the mold section is molded in a rectangular shape in plan view, and the common connecting section 26 is placed along one side of the mold section. When the mold section is molded in a rectangular shape in plan view, it is desired to place the common connecting section 26 along a longer side of the mold section.

Although the common connecting section 26 is extended from a different side from the other terminals (Mv, Mu, Mw, Mm, Gh, Gm, and Gl) in Embodiment 1, it may be extended from the same side. The common connecting section 26 may be bent in a direction orthogonal to the surface of the die pad on which the semiconductor device is mounted. In such a case, whether it is bent toward the surface on which the semiconductor device is mounted or opposite to the surface on which the semiconductor device is mounted may be determined as appropriate.

Description is made of the common connecting section 26 in Embodiment 1 by using the w-phase switching elements 21w, 22w, and 23w as an example. As shown in FIG. 2, a drain of the switching element 21w is connected to a power source line from a power source terminal Vd through the beam 28b and the die pad 25a.

A gate of the switching element 21w is connected to the terminal Gh through a wire bond, and a source of the switching element 21w is connected to a drain of the switching element 22w through the beam 28a. A source of the switching element 22w is connected to the outer lead frame 25b, that is, the common connecting section 26 through the beam 28c. A ground terminal God is also connected to the common connecting section 26 through the shunt resistance 24 and the beam.

In this manner, the circuit section upstream from the shunt resistance 24 is extended from the inverter circuit associated with the motor phase windings to the outside of the mold section and is integrated, at the common connecting section 26 formed of the lead frame 25b. The terminals connected to the wiring downstream from the shunt resistance 24 are extended to the outside of the mold section in a comb shape.

As a comparative example for Embodiment 1, a region corresponding to a mold section in a conventional semiconductor module is indicated by an alternate long and short dashed line B in FIG. 2. In the conventional semiconductor module, the mold section covers not only the region indicated by the broken line A but also the region indicated by the alternate long and short dashed line B, that is, all the areas except the terminals extended downward in FIG. 2.

As described above, according to Embodiment 1, the common connecting section 26 for connecting the terminals at the same potential in the circuits is placed outside the mold section to allow the reduction of the size of the semiconductor module 1. Since the common connecting section 26 is a portion of the lead frame 25 that would be placed within the mold section in the conventional semiconductor module, the mold section is reduced in size as compared with the conventional one, thereby reducing the amount of the mold resin and the material cost.

Since the common connecting section 26 can be formed with the same method as the conventional method of producing the lead frame 25, the metal material of the lead frame 25 can be effectively used without increasing the manufacture cost or complicating the operation process.

The common connecting section 26 is formed of a portion of the outer lead frame 25b, so that it can be used as a hold section for positioning or movement for work in molding after the semiconductor device is mounted on the lead frame 25 and is connected to the beam 28 and the wire bond 27. In addition, since the common connecting section 26 also serves as the terminal, it can be used as an electrical and mechanical connecting section in assembling the finished semiconductor module 1 onto the apparatus.

When the mold section is formed in a rectangular shape in plan view, the common connecting section 26 is placed along a longer side of the mold section to provide the advantage of improving the rigidity of the semiconductor module 1 to limit bowing. Since the common connecting section 26 is extended from the different side from the other terminals, it does not interfere with the connection between the other terminals and external parts.

The ground line is connected to the common connecting section 26 and is placed outside the mold section in Embodiment 1, so that any flow of abnormal current can be prevented if the common connecting section 26 and the housing of the control unit 200 are short-circuited due to an accident or the like. Since the use of the common connecting section 26 can reduce the number of connections on the ground line, the impedance is reduced to suppress the noise.

Embodiment 2

Figure 3:
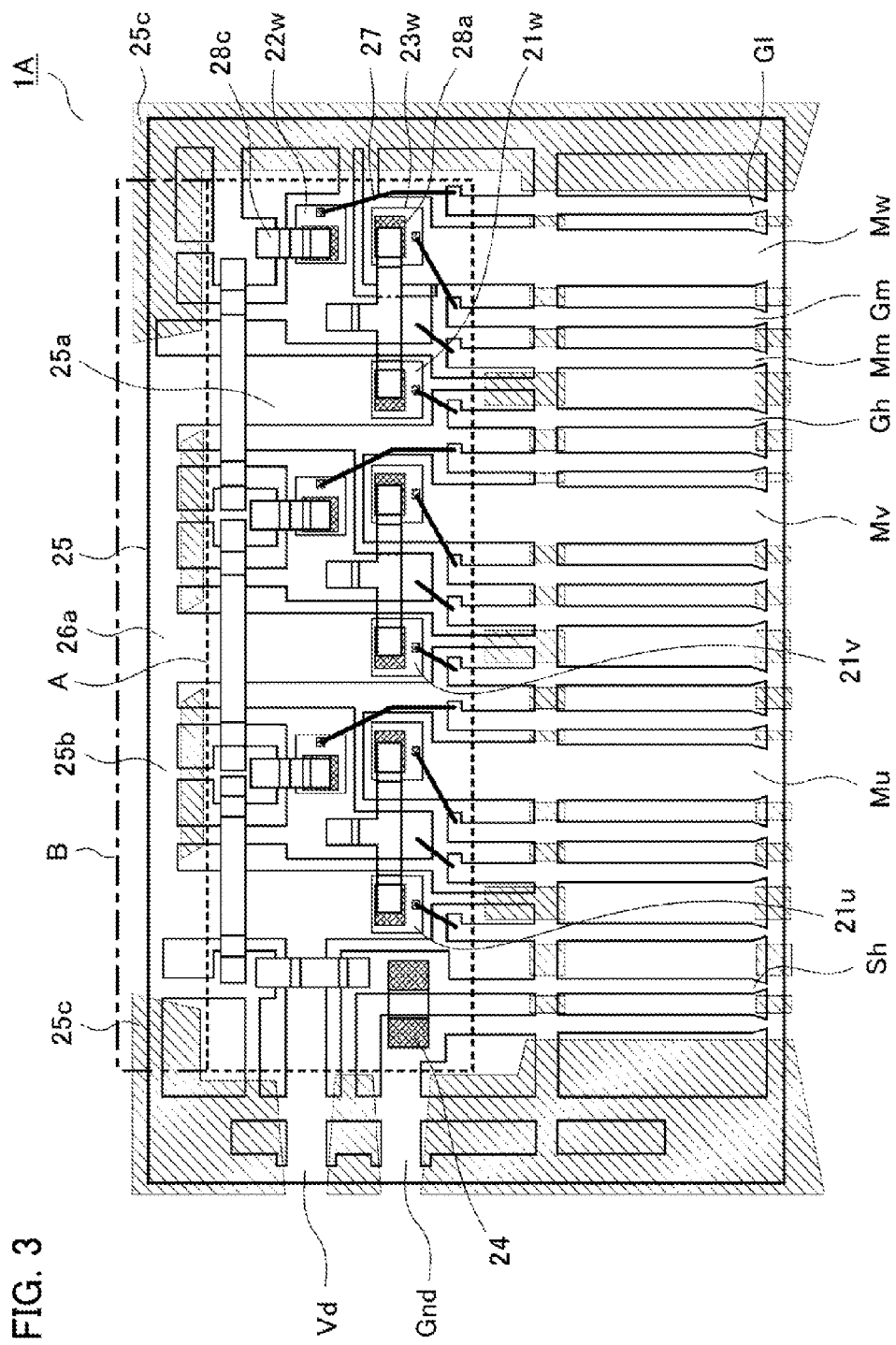
FIG. 3 is a plan view transparently showing a semi-finished product of a semiconductor module according to Embodiment 2 of the present invention.

FIG. 3 is a plan view transparently showing a semi-finished semiconductor module according to Embodiment 2 of the present invention. In FIG. 3, components identical or corresponding to those in FIG. 1 are designated with the same reference numeral. A semiconductor module 1A according to Embodiment 2 constitutes the inverter circuit 2 in the overall circuit diagram of the power steering apparatus shown in FIG. 1.

Since the circuit configuration of the power steering apparatus according to Embodiment 2 is similar to that of Embodiment 1, description thereof is omitted. In FIG. 3, a broken line A indicates a region corresponding to a mold section of the semiconductor module 1A in Embodiment 2, and an alternate long and short dashed line B indicates a region corresponding to a mold section of a conventional semiconductor module serving as a comparative example.

The semiconductor module 1A according to Embodiment 2 includes a common connecting section 26a in which the power source line and the power source terminal Vd in the circuit diagram of FIG. 1 are connected at an outer lead frame 25b. As shown in FIG. 3, a drain of a switching element 21u is connected to the power source terminal Vd and the common connecting section 26a. Similarly, drains of switching elements 21v and 21w are also connected to the power source terminal Vd and the common connecting section 26a.

The common connecting section 26a placed outside the mold section serves as a common wiring providing an integrated power source line and can be used as the power source terminal Vd. The common connecting section 26a is placed along one side of the mold section molded in a rectangular shape in plan view. The common connecting section 26a is extended from a different side from other terminals (Mv, Mu, Mw, Mm, Gh, Gm, and Gl).

According to Embodiment 2, the common connecting section 26a for connecting the drains of the switching elements 21u, 21v, and 21w to the power source line and the power source terminal Vd is placed outside the mold section to allow a reduction in size of the semiconductor module 1A, resulting in the same effects as those in Embodiment 1. The use of the common connecting section 26a can reduce the number of connections on the power source line, so that the impedance is reduced to limit the loss.

Since the common connecting section 26a is configured such that the terminals connected to the switching elements 21u, 21v, and 21w corresponding to chip parts are connected outside the mold section to provide the common wiring, the heat radiation property can be improved to achieve uniform heat generation in the chip components.

Embodiment 3

Figure 4:
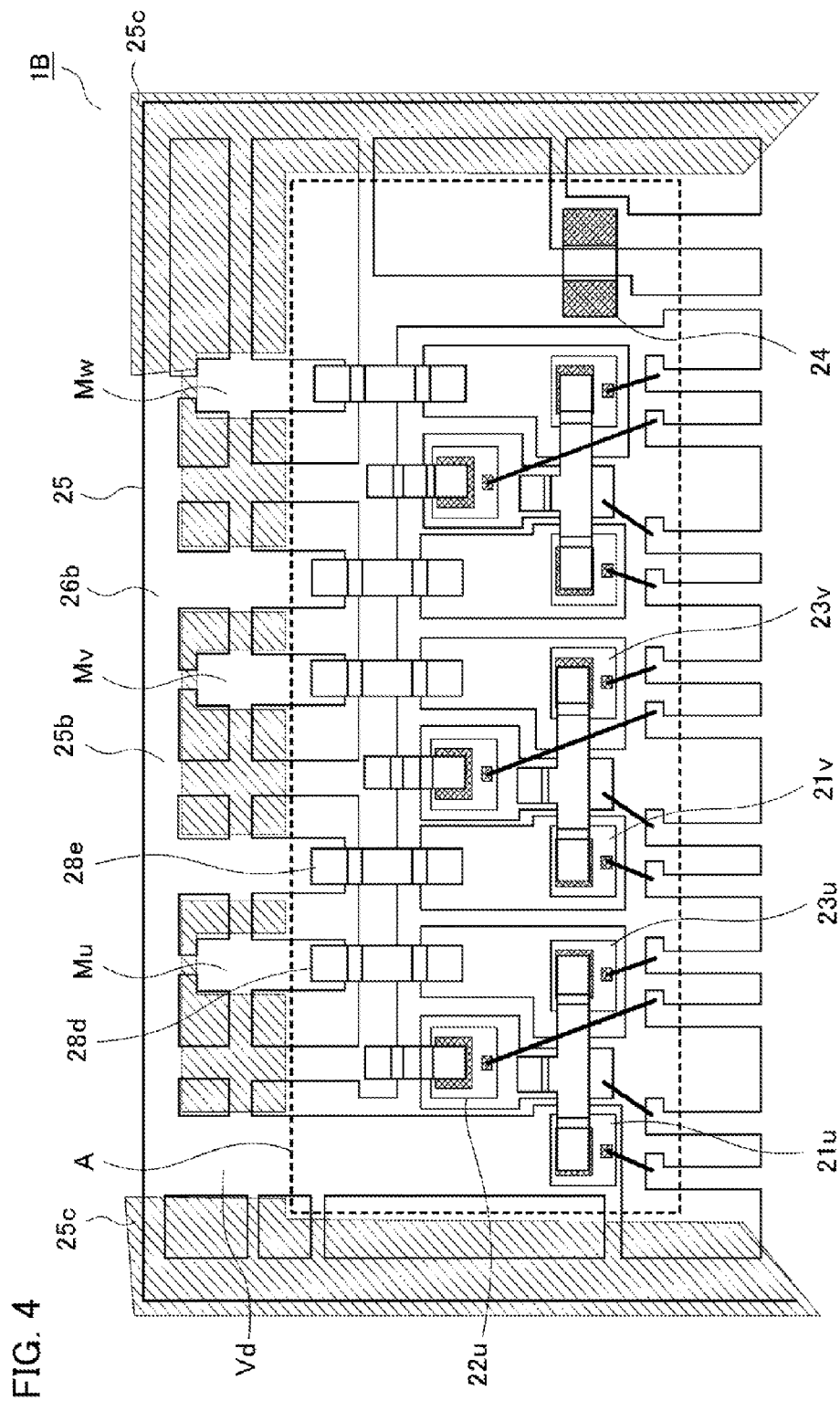
FIG. 4 is a plan view transparently showing a semi-finished product of a semiconductor module according to Embodiment 3 of the present invention.
Figure 5:
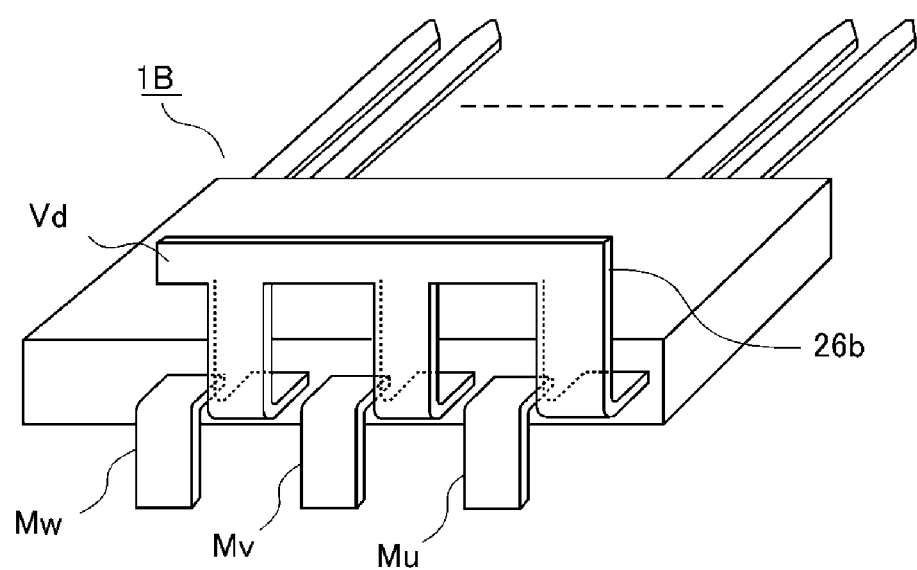
FIG. 5 is a perspective view showing the semiconductor module according to Embodiment 3 of the present invention.

FIG. 4 is a plan view transparently showing a semi-finished semiconductor module according to Embodiment 3 of the present invention. FIG. 5 is a perspective view showing the semiconductor module according to Embodiment 3. In FIG. 4, components identical or corresponding to those in FIG. 1 are designated with the same reference numerals. A semiconductor module 1B according to Embodiment 3 constitutes the inverter circuit 2 in the overall circuit diagram of the power steering apparatus shown in FIG. 1.

Since the circuit configuration of the power steering apparatus according to Embodiment 3 is similar to that of Embodiment 1, description thereof is omitted. In FIG. 4, a broken line A indicates a region corresponding to a mold section of the semiconductor module 1B in Embodiment 3.

A common connecting section 26b of the semiconductor module 1B according to Embodiment 3 is provided by connecting the power source line and the power source terminal Vd in the circuit diagram of FIG. 1 at an outer lead frame 25b, similarly to Embodiment 2 described above.

In Embodiment 3, however, terminals Mu, Mv, and Mw for motor output connected to a motor 100 and the common connecting section 26b serving as the power source terminal Vd are extended from the same side of the mold section molded in a rectangular shape in plan view.

Description is now made with a u-phase used as an example. U-phase switching elements 21u, 22u, and 23u are placed as shown in FIG. 4. A drain of the switching element 21u is connected to the power source terminal Vd and the common connecting section 26b corresponding to the power source line, and a source of the switching element 23u is connected to the terminal Mu for motor output through a beam 28d.

The v-phase and w-phase switching elements are similarly placed, and the terminals Mu, Mv, and Mw for motor output are extended upward in FIG. 4. A drain of the switching element 21v is connected to the power source terminal Vd and the common connecting section 26b through a beam 28e.

Out of the terminals extended to the outside of the mold section, the terminals Mu, Mv, and Mw for motor output are relatively short, and the power source terminal Vd is relatively long. The power source terminal Vd is connected to the end portion of each phase at the common connecting section 26b.

In this state, an unnecessary lead frame 26c indicated by hatch lines in FIG. 4 is cut. As shown in FIG. 5, the terminals Mu, Mv, and Mw for motor output are bent downward, and the common connecting section 26b corresponding to the power source terminal Vd is bent upward. This prevents the close proximity of the terminals Mu, Mv, and Mw for motor output to the power source terminal Vd.

When the common connecting section 26b and the other terminals (the terminals MU, Mv, and Mw for motor output in FIG. 4) not connected to the common connecting section 26b are extended from one side of the mold section in this manner, at least one of them is bent in a direction orthogonal to a surface of the die pad on which the semiconductor device is mounted.

Although both the common connecting section 26b and the terminals Mu, Mv, and Mw for motor output are bent in the opposite directions orthogonal to the surface of the die pad on which the semiconductor device is mounted in the example shown by FIG. 5, only one of them may be bent.

When only one of the common connecting section 26b and the terminals Mu, Mv, and Mw for motor output is bent, which of them is bent can be determined as appropriate. When only one of them is bent, whether it is bent toward the surface of the die pad on which the semiconductor device is mounted or opposite to the surface on which the semiconductor device is mounted can be determined as appropriate.

For example, when the common connecting section 26b is bent toward the surface of the die pad on which the semiconductor device is mounted, interference of the common connecting section 26b with a heat sink can be prevented in mounting the heat-radiating surface of the semiconductor module 1B on the heat sink.

When the common connecting section 26b is bent opposite to the surface of the die pad on which the semiconductor device is mounted, the size of the semiconductor module 1B in an upper face direction can be reduced. For example, when terminals Gh, Gl, and Gm for control signal of the respective switching elements mounted on the semiconductor module 1B are extended toward the upper face of the module and connected to a control substrate 3, the terminals for control signal can be reduced in length to improve the noise immunity.

The shape of the common connecting section 26b is not limited to the shape shown in FIG. 5, but various shapes are possible. For example, to facilitate connection with a power source line on an apparatus on which the semiconductor module 1B is attached, one end of the common connecting section 26b may be formed in a terminal shape. For connection to the capacitor 7 in the circuit diagram of FIG. 1, one end of the common connecting section 26b may be provided with a notch. This facilitates the positioning and the connection.

According to Embodiment 3, the common connecting section 26b for connecting the drains of the switching elements 21u, 21v, and 21w to the power source line terminal Vd is placed outside the mold section to allow a reduction in size of the semiconductor module 1B, resulting in the same effects as those in Embodiment 2.

Embodiment 4

Figure 6:
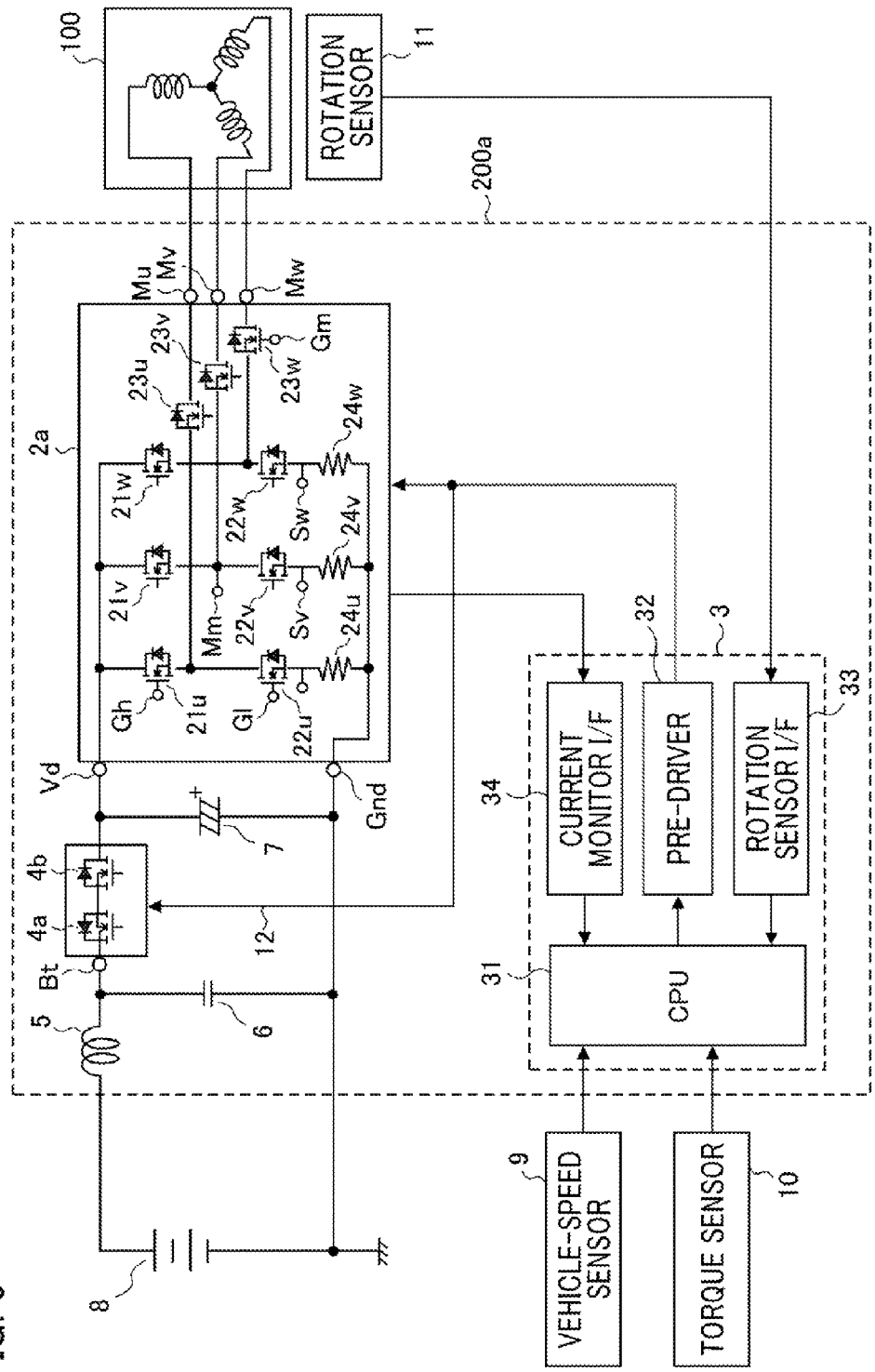
FIG. 6 is an overall circuit diagram of a power steering apparatus in which a semiconductor module according to Embodiment 4 of the present invention is used.
Figure 7:
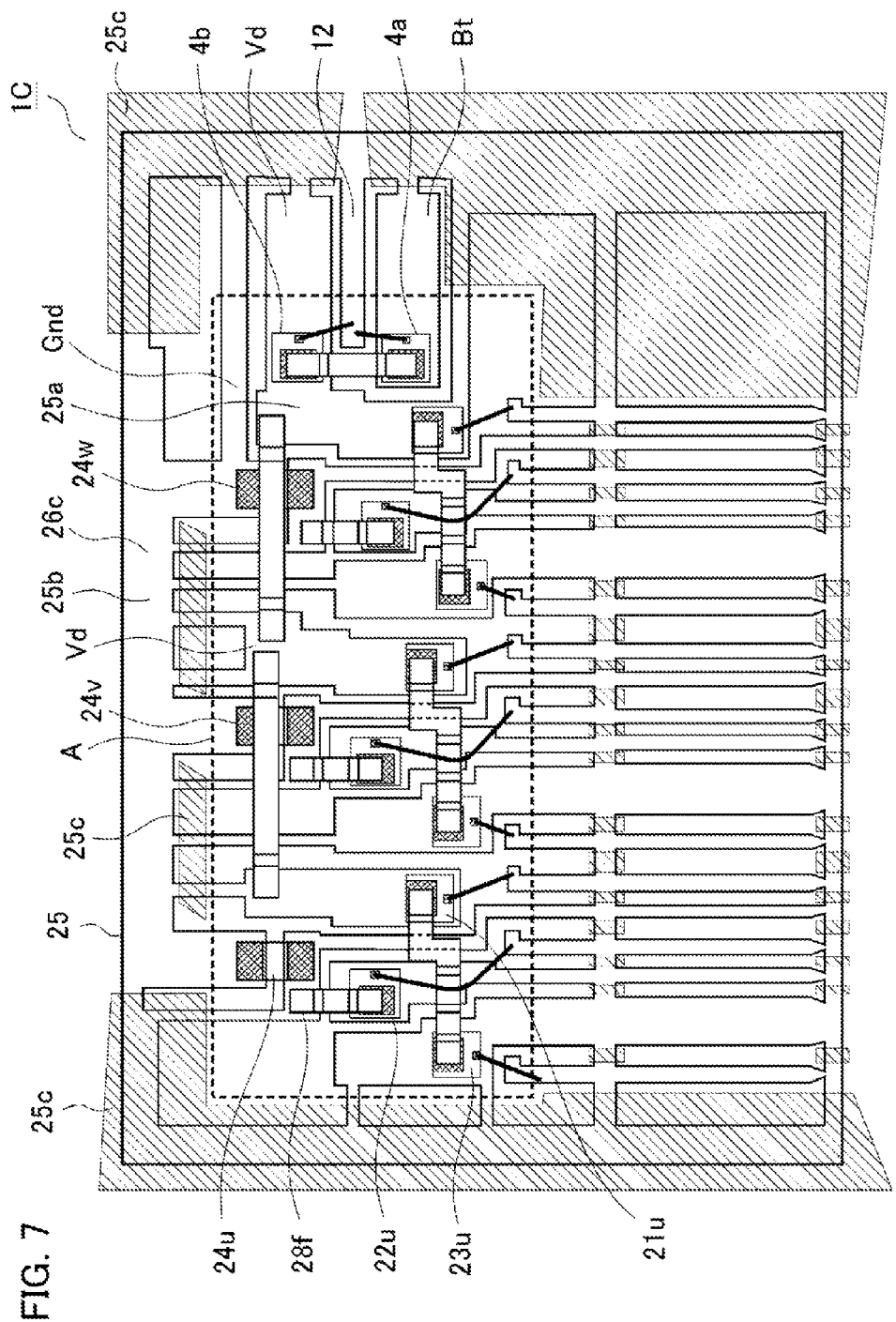
FIG. 7 is a plan view transparently showing a semi-finished product of the semiconductor module according to Embodiment 4 of the present invention.

FIG. 6 is an overall circuit diagram of a power steering apparatus in which a semiconductor module according to Embodiment 4 is used. FIG. 7 is a plan view transparently showing a semi-finished product of the semiconductor module according to Embodiment 4. In FIG. 6, components identical or corresponding to those in FIG. 1 are designated with the same reference numerals, and description is omitted. An inverter circuit 2a included in a control unit 200a shown by FIG. 6 is constituted of a single part as a semiconductor module 1C according to Embodiment 4.

As shown in FIG. 6, the circuit of the power steering apparatus according to Embodiment 4 is configured such that shunt resistances 24u, 24v, and 24w for current detection are placed in the inverter circuit 2a for respective phases. Since the remaining configuration is identical to that in FIG. 1, description thereof is omitted.

Since the inverter circuit 2a in Embodiment individually detects the currents flowing through the respective phases, it has the advantages of simplifying the configuration of the monitor and allowing more accurate detection of the current in Embodiment 4, however, the three shunt resistances 24u, 24v, and 24w contained in the semiconductor module 1C increase the number of parts and require additional consideration of wiring.

As shown in FIG. 7, the semiconductor module 1C according to Embodiment 4 includes a common connecting section 26c in which wirings downstream from the shunt resistances 24u, 24v, and 24w in the circuit diagram of FIG. 6, that is, ground lines are connected at an outer lead frame 25b. In FIG. 7, a broken line A indicates a region corresponding to a mold section of the semiconductor module 1C in Embodiment 4.

Description is now made with a u-phase used as an example. An upper-arm switching element 21u, a lower-arm switching element 22u, and a switching element 23u for motor are placed as shown in FIG. 7. A source of the lower-arm switching element 22u is connected to the shunt resistance 24u through a beam 28f.

The shunt resistance 24u is connected downstream to the outer lead frame 25b, that is, the common connecting section 26c, and is placed outside the mold section of the semiconductor module 1C. For the v-phase and the w-phase, the shunt resistances 24v and 24w are similarly extended downstream to the lead frame 25b, and the ground lines of the respective phases are connected at the common connecting section 26c. The common connecting section 26c is connected to a ground terminal Gnd.

As shown in FIG. 7, the semiconductor module 1C contains switching elements 4a, 4b (see FIG. 6) constituting a relay 4 for connecting or disconnecting a power source line. Since the switching elements 4a and 4b are formed of FETs, for example, they are easily integrated into the semiconductor module 10.

The common connecting section 26c is placed along a longer side of the mold section molded in a rectangular shape in plan view. On a shorter side, four lines in total, including terminals (Bt, Vd, and Gnd) and a control line 12, are extended.

According to Embodiment 4, the common connecting section 26c serving as the common wiring capable of integrating the ground lines downstream from the shunt resistances 24u, 24v, and 24w is placed outside the mold section to allow a reduction in size of the semiconductor module 1C, resulting in the same effects as those in Embodiment 1.

Embodiment 5

Embodiments 1 to 4 have been described in conjunction with the common connecting section formed of a portion of the lead frame 25. In Embodiment 5, a common connecting section formed of a plate member different from the lead frame is described.

Figure 8:
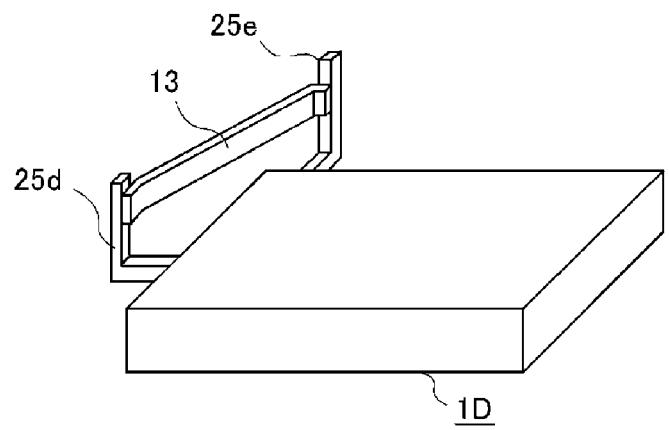
FIG. 8 is a perspective view showing a semiconductor module according to Embodiment 5 of the present invention.

FIG. 8 is a perspective view showing a semiconductor module according to Embodiment 5. A semiconductor module 1D connects terminals 25d and 25e formed of lead frames to a common connecting section 13 formed of a plate member different from the lead frame. The common connecting section 13 connects at least one set of terminals at the same potential in the circuits outside a mold section, similarly to the common connecting section formed of the lead frame.

Although FIG. 8 shows the two terminals 25d and 25e connected at the common connecting section 13, two or more terminals may be connected at the common connecting section 13. The common connecting section 13 and the terminals 25d and 25e can be connected with welding, brazing, or swaging. The strength of the connecting section can be enhanced by making connection with welding or blazing and to performing swaging.

As shown in FIG. 8, the common connecting section 13 can connect terminals extended from two different sides of the mold section molded in a rectangular shape in plan view. When the terminals at the same potential are extended from the two different sides in this manner, the common connecting section 13 provides the impedance reducing effect larger than that of the common connecting section formed of the lead frame.

Figure 9:
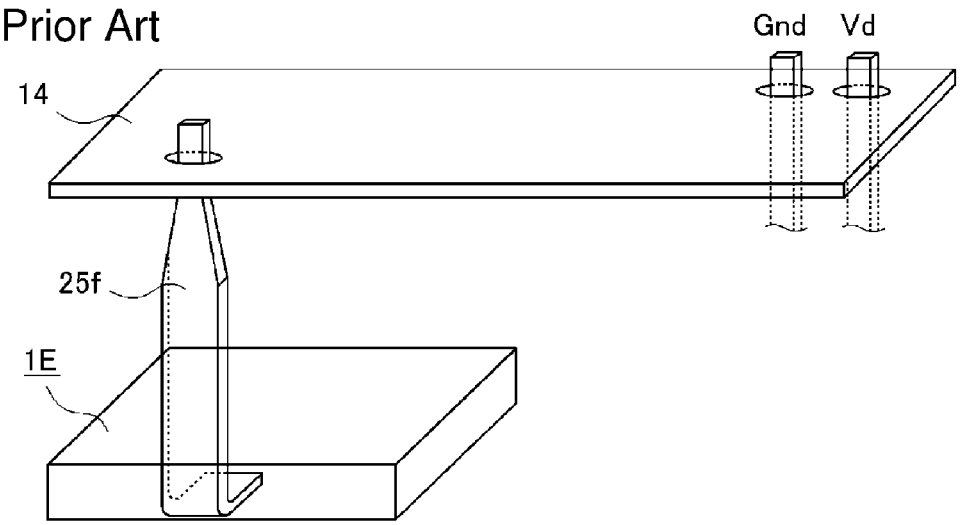
FIG. 9 is a perspective view showing a semiconductor module serving as a comparative example.

FIG. 9 shows a conventional semiconductor module as a reference example for Embodiment 5. In a conventional semiconductor module 1E, a separate member such as a power wiring substrate 14 may be used in connecting a terminal 25f to an external part. The power wiring substrate 14 may be shared with a wiring for a power source terminal Vd and a ground terminal Gnd, for example. When the terminal 25f of the semiconductor module 1E is extended to the power wiring substrate 14, the terminal 25f is disadvantageously increased in length.

In contrast, the common connecting section 13 in Embodiment 5 connects the terminals 25d and 25e at the same potential without requiring any other component than the semiconductor module 1D, so that the terminal does not need to be extended to the power wiring substrate 14 as shown in FIG. 9, a bus bar, or the like. Thus, the terminals 25d and 25e can be relatively short to provide the effects of reducing the size of the semiconductor module 1D and reducing the impedance.

Since the terminals 25d and 25e connected to the common connecting section 13 may be relatively short, the original lead frame can be reduced in size or portions to be discarded can be reduced to allow the effective use of the lead frame. In the present invention, the embodiments can be freely combined, or the embodiments can be modified or omitted as appropriate, within the scope of the present invention.

INDUSTRIAL APPLICABILITY

The present invention can be used, as a semiconductor module including a plurality of switching elements mounted on a lead frame, for an inverter circuit or the like.

The invention claimed is:
1. A semiconductor module comprising:
  a lead frame having a plurality of seats electrically independent of each other;
  a plurality of electronic parts comprising a plurality of semiconductor devices mounted on the seats;
  a mold section provided by integrating the lead frame and the plurality of electronic parts with a mold resin, the plurality of electronic parts constituting a plurality of circuits, wherein a portion of the lead frame extends outside of the mold section providing a plurality of terminals each connecting a respective circuit from among the plurality of circuits hosted in the semiconductor module to a component outside of the semiconductor module; and a common connecting section connecting at least one set of the plurality of terminals at the same potential in the circuits outside the mold section, and serving as a common wiring for at least one of: power source lines and ground lines in the circuits and is a terminal for connecting the common wiring to at least one of a power source terminal and a ground source terminal.

2. The semiconductor module according to claim 1, wherein the common connecting section is formed of the lead frame extended to the outside of the mold section.

3. The semiconductor module according to claim 2, wherein the common connecting section forms a portion of an outer frame of the lead frame.

4. The semiconductor module according to claim 2, wherein the mold section is molded in a rectangular shape in a planner view, and wherein the common connecting section is placed along one side of the mold section.

5. The semiconductor module according to claim 2, wherein the mold section is molded in a rectangular shape in a planner view, and wherein the common connecting section is placed along a longer side of the mold section.

6. The semiconductor module according to claim 2, wherein the common connecting section is bent in a direction orthogonal to a surface of the seat on which the semiconductor device is mounted.

7. The semiconductor module according to claim 2, wherein the common connecting section is bent toward a surface of the seat on which the semiconductor device is mounted.

8. The semiconductor module according to claim 2, wherein the common connecting section is bent opposite to a surface of the seat on which the semiconductor device is mounted.

9. The semiconductor module according to claim 2, wherein the mold section is molded in a rectangular shape in a planner view, and wherein, when the common connecting section and one terminal that is not connected to the common connecting section, are extended from one side of the mold section, at least one of the common connecting section and the terminal is bent in a direction orthogonal to a surface of the seat on which the semiconductor device is mounted.

10. The semiconductor module according to claim 1, wherein the common connecting section is formed of a plate member different from the lead frame.

11. The semiconductor module according to claim 10, wherein the mold section is molded in a rectangular shape in a planner view, and wherein the common connecting section connects another set of the terminals extended from two different sides of the mold section.

12. The semiconductor module according to claim 1, wherein the common connecting section is configured such that the terminals connected to the electronic parts provide the common wiring.

13. The semiconductor module according to claim 1, wherein the common connecting section is formed of another portion of the outer lead frame and is a holding section, which positions a work in the mold after the semiconductor device is mounted onto the lead frame and wherein the common connecting section is connected to at least one of the ground terminal and the power terminal via a shunt resistance and a beam, which is a bridge over the lead frame.

14. The semiconductor module according to claim 1, wherein a wire bond, which connects at least another set of the terminals comprising control and monitor signal terminals to the electronic parts.

* * * * *